United States Patent
Cobo et al.

(10) Patent No.: US 8,928,393 B1
(45) Date of Patent: Jan. 6, 2015

(54) TEMPERATURE SWITCH CIRCUIT HAVING DYNAMIC TEMPERATURE THRESHOLDS

(71) Applicant: International Business Machines Corporation, Armonk, NY (US)

(72) Inventors: Milton Cobo, Raleigh, NC (US);
Michael DeCesaris, Carrboro, NC (US);
Eric E. Pettersen, Raleigh, NC (US);
Luke D. Remis, Raleigh, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/067,273

(22) Filed: Oct. 30, 2013

(51) Int. Cl.
| | | |
|---|---|---|
| H01L 35/00 | (2006.01) | |
| H02M 3/156 | (2006.01) | |
| G01K 3/00 | (2006.01) | |
| H03K 17/14 | (2006.01) | |

(52) U.S. Cl.
CPC .............. *H02M 3/156* (2013.01); *G01K 3/005* (2013.01); *H03K 17/14* (2013.01)
USPC ....................................................... 327/512

(58) Field of Classification Search
CPC ............ G01K 3/005; G01K 7/01; H03L 1/02; H03K 3/027; H03K 3/03; H03K 3/011; H03K 17/14–17/145; G06F 11/002; G06F 9/4893; G06F 1/206
USPC ....................................................... 327/512
See application file for complete search history.

(56) References Cited

U.S. PATENT DOCUMENTS

| | | | |
|---|---|---|---|
| 5,085,526 A | | 2/1992 | Sawtell et al. |
| 5,451,892 A | * | 9/1995 | Bailey ........................ 327/113 |
| 5,475,846 A | * | 12/1995 | Moore ........................ 710/260 |
| 5,805,403 A | * | 9/1998 | Chemla ........................ 361/103 |
| 5,838,578 A | | 11/1998 | Pippin |
| 6,081,783 A | * | 6/2000 | Divine et al. ................. 704/500 |
| 6,393,374 B1 | * | 5/2002 | Rankin et al. ................. 702/132 |
| 6,717,530 B1 | | 4/2004 | Schmidt et al. |

(Continued)

FOREIGN PATENT DOCUMENTS

JP   5085526 B2   11/2012

OTHER PUBLICATIONS

Maxim, "Dual-Output Remote-Junction Temperature Switches" MAX6685/MAX6686, www.maxim-ic.com, 19-2459; Rev 2; 4/03, 2003 Maxim Integrated Products, 7 pages.

(Continued)

*Primary Examiner* — Thomas J Hiltunen
(74) *Attorney, Agent, or Firm* — Katherine S. Brown; Jeffrey L. Streets

(57) ABSTRACT

An apparatus comprising a temperature switch and a logic device, and a method of implementing multiple dynamic temperature thresholds. The temperature switch has a temperature sensor, a temperature threshold select input, and an output to a temperature threshold interrupt line, wherein the temperature switch selects a current temperature threshold from multiple predetermined temperature thresholds as determined by a state of the temperature threshold select input. The temperature switch causes an interrupt assertion on the temperature threshold interrupt line in response to the temperature sensor indicating a sensed temperature that exceeds the temperature threshold. The logic device has an input coupled to the temperature threshold interrupt line and a temperature threshold select output coupled to the temperature threshold select input of the temperature switch. The logic device automatically increments the temperature threshold select output in response to detecting an interrupt assertion on the temperature threshold interrupt line.

16 Claims, 5 Drawing Sheets

(56) References Cited

U.S. PATENT DOCUMENTS

| | | | | |
|---|---|---|---|---|
| 6,974,252 | B2* | 12/2005 | Bowden et al. | 374/163 |
| 6,976,159 | B1* | 12/2005 | Poduska et al. | 713/1 |
| 7,228,508 | B1* | 6/2007 | Pippin | 716/136 |
| 7,467,318 | B2* | 12/2008 | Bruno et al. | 713/500 |
| 7,532,056 | B2* | 5/2009 | Seo | 327/512 |
| 7,887,235 | B2* | 2/2011 | Campos et al. | 374/178 |
| 2009/0063841 | A1* | 3/2009 | Chien | 713/2 |
| 2010/0205464 | A1* | 8/2010 | Rotem et al. | 713/300 |

OTHER PUBLICATIONS

Octrooiraad Nederland, "Document No. 6717530", Dec. 21, 1967, International Standard Electric Corporation, 5 pages.

Texas Instruments, "LM77 9-Bit + Sign Digital Temperature Sensor and Thermal Window Comparator with Two-Wire Interface", IM77, SNIS103E—May 2004—Revised Oct. 2010, www.ti.co, 2 pages.

Microchip, "Resistor-Programmable Temperature Switches", MCP9509/10, 2008 Microchip Technology, Inc. DS22114A, Jan. 2, 2008, 28 pages.

* cited by examiner

THRESHOLD TABLE

| S1 | S0 | TEMPERATURE THRESHOLD |
|---|---|---|
| 0 | 0 | 70°C |
| 0 | 1 | 80°C |
| 1 | 0 | 90°C |
| 1 | 1 | 100°C |

US 8,928,393 B1

TEMPERATURE SWITCH CIRCUIT HAVING DYNAMIC TEMPERATURE THRESHOLDS

BACKGROUND

1. Field of the Invention

The present invention relates to a temperature switch and use of a temperature switch to monitor the temperature of a heat-generating device.

2. Background of the Related Art

Computer systems includes many electronic components that generate heat as a byproduct of their intended function. This waste heat can build up to temperatures that will damage the component or adjacent components unless the heat is removed. Fans are commonly used to circulate air through chassis that house the components for the purpose of keeping the components cool. However, the fans also consume electricity and produce noise, so it is desirable to limit fans speeds.

In order to be assured that the temperature of a component does not exceed its recommended operating conditions, it is necessary to provide temperature sensors and systems for monitoring the temperature. Control systems, such as a fan controller, may be included to prevent the temperature from exceeding a setpoint or threshold. Even still, fans can fail and a management system may need to monitor the temperature for excessive temperatures at which the system may need to be throttled or shutdown. For these purposes, a modern computer system may include the use of a temperature switch.

A temperature switch is a circuit that generates or changes an output when a monitored temperature crosses a temperature setpoint or threshold. Some commercially available temperature switches have one or more predetermined temperature thresholds, such as a high temperature threshold and a low temperature threshold, at which the temperature switch will provide an output signal. For example, a temperature switch may assert a first temperature interrupt if the monitored temperature crosses a low temperature threshold of 70° C., then assert a second temperature interrupt if the monitored temperature crosses a high temperature threshold of 100° C.

BRIEF SUMMARY

One embodiment of the present invention provides an apparatus, comprising a temperature switch and a logic device. The temperature switch has a temperature sensor, a temperature threshold select input, and an output to a temperature threshold interrupt line, wherein the temperature switch selects a current temperature threshold from multiple predetermined temperature thresholds as determined by a state of the temperature threshold select input. The temperature switch causes an interrupt assertion on the temperature threshold interrupt line in response to the temperature sensor indicating a sensed temperature that exceeds the temperature threshold. The logic device has an input coupled to the temperature threshold interrupt line and a temperature threshold select output coupled to the temperature threshold select input of the temperature switch. The logic device automatically increments the temperature threshold select output in response to detecting an interrupt assertion on the temperature threshold interrupt line.

Another embodiment of the present invention provides a method, comprising a temperature switch sensing a temperature and comparing the sensed temperature to a current temperature threshold, wherein the current temperature threshold is selected from multiple predetermined temperature thresholds as determined by a state of at least one temperature threshold select input to the temperature switch. The method further includes the temperature switch causing an interrupt assertion on a temperature threshold interrupt line in response to the sensed temperature exceeding the current temperature threshold. A logic device monitors the temperature threshold interrupt line for an interrupt assertion and automatically increments an output to the at least one temperature threshold select input of the temperature switch in response to detecting an interrupt assertion on the temperature threshold interrupt line.

DETAILED DESCRIPTION

Figure 1:
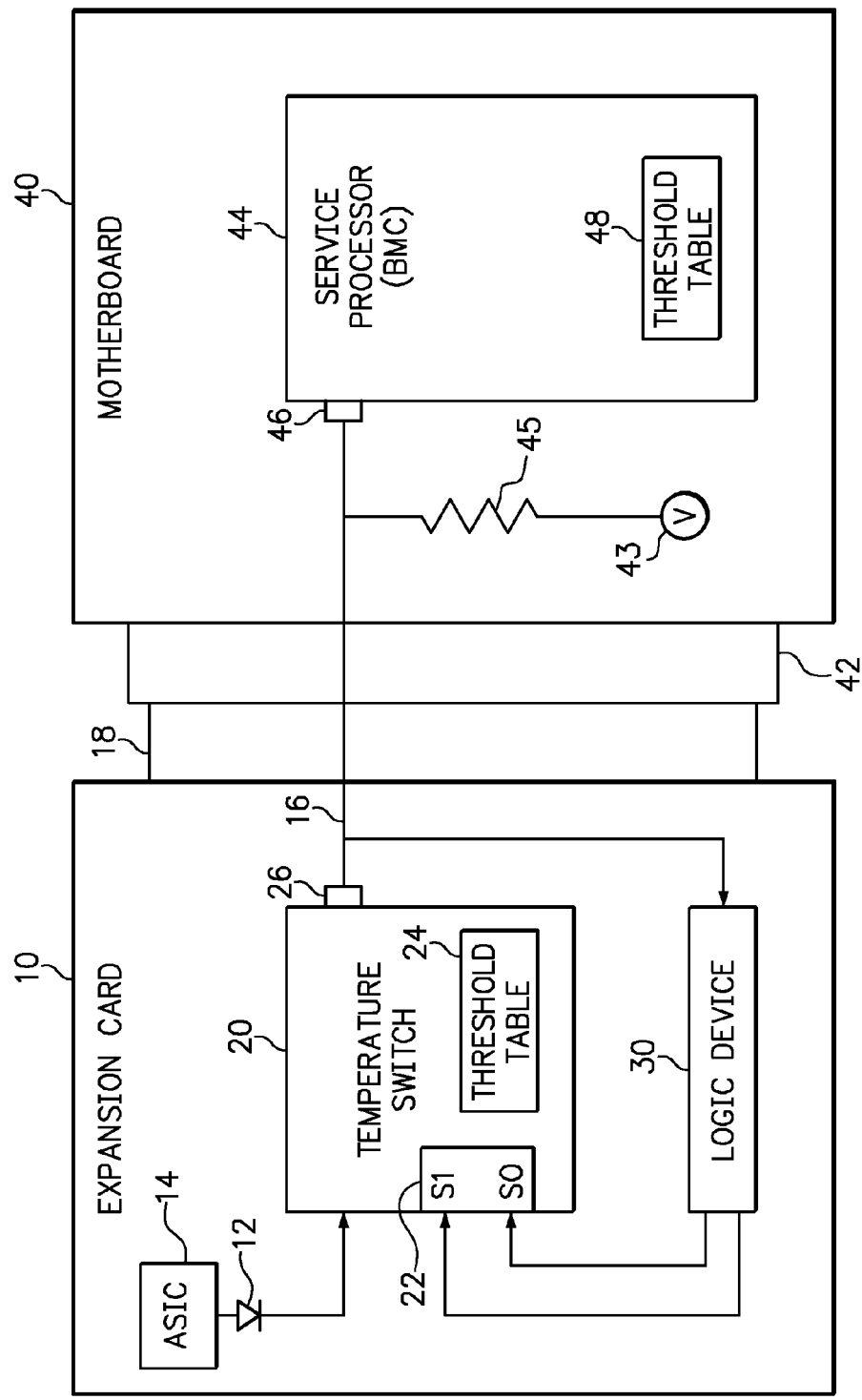
FIG. 1 is a diagram of an expansion card with a circuit including a temperature switch and logic device in accordance with one embodiment of the present invention.

One embodiment of the present invention provides an apparatus, comprising a temperature switch and a logic device. The temperature switch has a temperature sensor, a temperature threshold select input, and an output to a temperature threshold interrupt line, wherein the temperature switch selects a current temperature threshold from multiple predetermined temperature thresholds as determined by a state of the temperature threshold select input. The temperature switch causes an interrupt assertion on the temperature threshold interrupt line in response to the temperature sensor indicating a sensed temperature that exceeds the temperature threshold. The logic device has an input coupled to the temperature threshold interrupt line and a temperature threshold select output coupled to the temperature threshold select input of the temperature switch. The logic device automatically increments the temperature threshold select output in response to detecting an interrupt assertion on the temperature threshold interrupt line.

In various embodiments, the apparatus may further comprise a service processor coupled to the temperature threshold interrupt line. For example, the temperature switch and logic device may be installed on an expansion card, the baseboard management controller may be installed on a motherboard, and the expansion card may be installed in an expansion slot of on the motherboard. Accordingly, the service processor is able to detect when a temperature of some component on the expansion board has exceeded a current temperature threshold.

Another embodiment of the apparatus may further comprise a resistor coupled between a voltage source and the temperature threshold interrupt line, wherein the resistor drives a logical "1" signal on the temperature threshold interrupt line. Accordingly, the output from the temperature switch to the temperature threshold interrupt line is an open-drain pin. In embodiments that include a service processor, the service processor may have an open-drain pin coupling the service processor to the temperature threshold interrupt line. Preferably, the logic device may detect an interrupt assertion in response to a falling edge of a signal on the temperature threshold interrupt line.

The temperature sensor may be any type of temperature sensor. Optionally, the temperature sensor may be a remote junction, which allows the temperature switch to be physically spaced apart from the temperature sensor and any component that is having its temperature sensed.

Still further, the temperature threshold select output of the logic device may provide digital signals to the temperature threshold select input of the temperature switch. Alternatively, the temperature threshold select output of the logic device may provide signals having more than two possible states to the temperature threshold select input of the temperature switch. Furthermore, the temperature threshold select input to the temperature switch may include any number of input pins as necessary to implement a desired number of temperature thresholds.

Another embodiment of the present invention provides a method, comprising a temperature switch sensing a temperature and comparing the sensed temperature to a current temperature threshold, wherein the current temperature threshold is selected from multiple predetermined temperature thresholds as determined by a state of at least one temperature threshold select input to the temperature switch. The method further includes the temperature switch causing an interrupt assertion on a temperature threshold interrupt line in response to the sensed temperature exceeding the current temperature threshold. A logic device monitors the temperature threshold interrupt line for an interrupt assertion and automatically increments an output to the at least one temperature threshold select input of the temperature switch in response to detecting an interrupt assertion on the temperature threshold interrupt line.

Optionally, the method may include a service processor counting a number of interrupt assertions detected on the temperature threshold interrupt line, wherein the service processor stores a list of the multiple predetermined temperature thresholds and identifies the current temperature threshold by the counted number of interrupt assertions. The multiple predetermined temperature thresholds are preferably stored in the order in which they are used. The method may further include the baseboard management controller causing an interrupt assertion on the temperature threshold interrupt line for a duration exceeding a predetermined duration, such that the logic device will reset the temperature threshold select output to the temperature switch in response to detecting an interrupt assertion that exceeds the predetermined duration. Accordingly, the temperature threshold select out is reset to a predetermined temperature threshold select value, and the baseboard management controller resets its count of the number of interrupt assertions. Furthermore, the baseboard management controller may cause an interrupt assertion of a second duration on the temperature threshold interrupt line in order to increment the counter in the logic device and cause the temperature threshold select input to the temperature switch to change accordingly.

In a further optional aspect of the method, the temperature threshold interrupt line is driven by a resistor to a logical "1" signal, wherein the temperature switch causes an interrupt assertion on the temperature threshold interrupt line using a single open-drain signal. The logic device may, for example, detect an interrupt assertion in response to a falling edge of a signal on the temperature threshold interrupt line.

Embodiments of the method may further comprise the temperature switch updating the current temperature threshold to a value selected from multiple predetermined temperature thresholds as determined by a state of the at least one temperature threshold select input to the temperature switch. Whenever the logic device changes the state of the temperature threshold select input, the temperature switch will update the temperature threshold to the associated value. The temperature threshold values associated with each state of the temperature threshold select input may be stored in a table. The temperature switch will deassert the interrupt assertion in response to the updated current temperature threshold exceeding the sensed temperature.

Embodiments of the present invention may provide a temperature switch that has a single output signal to indicate an over-temperature condition, and a method and apparatus for implementing a circuit about the temperature switch so that the temperature switch performs like a dynamic multiple threshold temperature switch. This may be done by adding logic around the temperature switch, such that as the temperature switch asserts each interrupt, the logic increments the temperature threshold by advancing the temperature threshold select input. Embodiments may provide a temperature switch having a selectable temperature threshold to perform as a temperature switch having multiple dynamic temperature thresholds. For example, a temperature switch having a fixed high temperature threshold "T(high)" and a selectable static low temperature threshold "T(low)" may be made to perform as if the temperature switch had multiple dynamic low temperature thresholds without affecting the high temperature threshold.

FIG. 1 is a diagram of an expansion card 10 with a circuit including a temperature switch 20 and logic device 30 in accordance with one embodiment of the present invention. The expansion card 10 has a remote junction 12 that monitors the temperature of a heat-generating component, such as the application specific integrated circuit (ASIC) 14. The remote junction 12 provides a signal representative of the sensed temperature to an input of the temperature switch. A temperature threshold select input 22 to the temperature switch 20 includes first and second input pins, S0 and S1, which are used to select a current temperature threshold from among multiple temperature thresholds stored in a threshold table 24. The threshold table 24 uniquely identifies a temperature threshold for each state of the temperature threshold select input 22. The temperature switch 20 compares the sensed temperature obtained by the remote junction 12 to the current temperature threshold, and will assert an interrupt signal onto a temperature threshold interrupt line 16 if the current temperature exceeds the current temperature threshold.

In the embodiment shown, the expansion card 10 includes a card edge connector 18 coupled into a socket 42 on a motherboard 40. Accordingly, the temperature threshold interrupt line 16 is coupled between the temperature switch 20 and a service processor 44, such as a baseboard management controller (BMC). As shown, the temperature threshold interrupt line 16 is also coupled to a voltage source 43 through a resistor 45, such that the interrupt line 16 is charged to a logical '1' state. The charge on the interrupt line or net 16 is 'weak', such that either the temperature switch 20 or the BMC 44 can use an open-drain interrupt pin 26, 46, respectively, to overdrive the interrupt line 16 and drive the signal to a logical '0'. One advantage of this configuration is that the resistor 45 is current limiting and allows multiple masters to assert the signal to a logical '0'. In other words, either the temperature sensor or the BMC or other service processor may assert the signal low.

The BMC 44 receives interrupt assertions from the temperature switch 20, and counts each interrupt assertion to keep track of the current temperature threshold that is being used by the temperature switch. In order to do this, the BMC 44 has a threshold table 48 that may include the same information as in the threshold table 24 of the temperature switch 20. Accordingly, when the BMC 44 receives an interrupt assertion on the interrupt line 16, the BMC can accurately interpret the temperature threshold that was exceeded. Specifically, the embodiment shown assures that both the temperature switch 20 and the BMC 44 will increment through their threshold tables 24, 48 in the same manner. Therefore, the BMC may associate each interrupt assertion as indicating that the sensed temperature has exceeded a particular temperature threshold.

The logic device 30 also has an input that is coupled to the temperature threshold interrupt line 16 in order to monitor to interrupt assertions. The logic device 30 includes a counter that increments on the falling edge of the signal on the interrupt line 16. Output from the logic device 30 to the temperature threshold select input 22 is incremented in response to detecting each interrupt assertion. Optionally, the logic device may further incorporation logic that allows the BMC to reset the counter back to a known state. For example, if the BMC was reset, then the BMC may no longer have an accurate count of the interrupt assertions and wouldn't know which temperature threshold was currently being used by the temperature switch.

In FIG. 1, the logic device 30 outputs digital signals (i.e., '0' and '1') on two leads to the two pins, S0 and S1, of the temperature sensor threshold select input 22. The various possible combinations of these two digital inputs identify which one of four temperature threshold values should be used as the current temperature threshold. Optionally, the logic device will increment the digital output in a predetermined pattern, such as (0,0), (0,1), (1,0), and then (1,1), and the threshold table 24 will associated each incremental input with a next higher temperature threshold.

However, embodiments of the present invention may also implement temperature sensor threshold select inputs that recognize a signal having more than two states. For example, a tri-state input may recognized GND, FLOAT and VDD signals. A tri-state input may be used to increase the number of selectable thresholds for a given number of threshold select inputs. It should be recognized that the present invention is equally applicable to threshold select signals having any number of multiple states. Furthermore, embodiments of the present invention may implement a temperature sensor having any number of threshold select inputs. Increasing the number of threshold select inputs will increase the number of selectable thresholds for a given number of input signal states.

Figure 2:
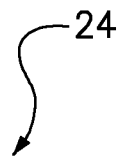
FIG. 2 is an illustration of a temperature threshold table.

FIG. 2 is an illustration of a temperature threshold table 24. The two left-hand columns of the table show the four possible combinations ((0,0), (0,1), (1,0), and (1,1)) of the digital signals (i.e., '0' and '1') that may be received at the two pins, S0 and S1, of the temperature sensor threshold select input 22. The combination of these two digital inputs that is received at the temperature sensor threshold select input 22 identifies which one of four temperature threshold values in the right-hand column should be used as the current temperature threshold. In this table 24, for example, an input of S1=0 and S0=0 (or (S1, S0)=(0,0)) causes the temperature switch to use a temperature threshold of 70° C., an input of S1=0 and S0=1 (or (S1, S0)=(0,1)) causes the temperature switch to use a temperature threshold of 80° C., an input of S1=1 and S0=0 (or (S1, S0)=(1,0)) causes the temperature switch to use a temperature threshold of 90° C., and an input of S1=1 and S0=1 (or (S1, S0)=(1,1)) causes the temperature switch to use a temperature threshold of 100° C. Preferably, the logic device will increment its digital output in a predetermined sequence, such as (0,0), (0,1), (1,0), and then (1,1). The BMC may include a similar table with the same temperature thresholds in the same sequence, although there is no need for the values of S0 and S1.

Figure 3:
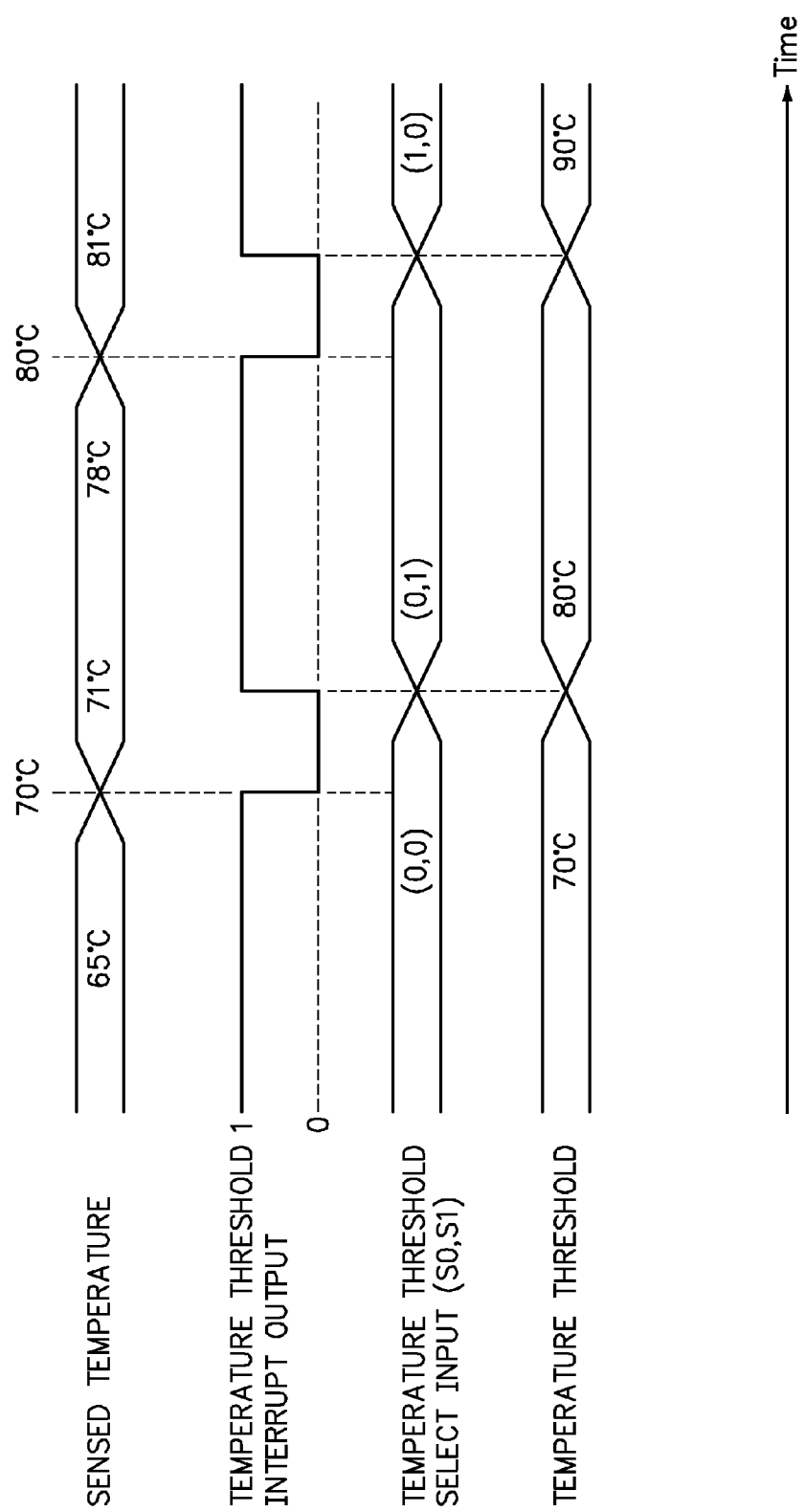
FIG. 3 is a timing diagram over a period of rising temperatures and incrementing temperature thresholds.

FIG. 3 is a timing diagram over a period of rising sensed temperatures and incrementing temperature thresholds. In the timing diagram, time advances from left to right as indicated by the arrow at the bottom of the Figure. A first row shows the "Sensed Temperature" initially at 65° C., crossing a first temperature threshold of 70° C., hitting 71° C. and past 78° C. before crossing a second temperature threshold of 80° C. and rising further to 81° C. A second row shows the "Temperature Threshold Interrupt Output" initially at a logical level "1". When the sensed temperature crosses 70° C., the temperature switch asserts an interrupt by driving the temperature threshold interrupt line to a logical "0". A third row shows the "Temperature Threshold Select Input", which is received by the temperature switch from the logic device, at an initial state of (0,0). When the logic device detects the first interrupt assertion (in the second row), the logic device increments its output to (0,1) and causes the temperature threshold select input of the temperature switch to receive the same (0,1) state. As shown in the fourth row, the new select input (0,1) causes the temperature switch to implement a current "Temperature Threshold" of 80° C. Since the sensed temperature no longer exceeds the current temperature threshold (i.e., 71° C.<80° C.), the temperature threshold interrupt output (second row) from the temperature switch is no longer driven to logical "0" and the interrupt clears. When the sensed temperature (first row) crosses the temperature threshold of 80° C., the temperature switch causes a second interrupt assertion, which results in an incrementing of the temperature threshold select input to (1,0) and an subsequent increase in the temperature threshold to 90° C. such that the interrupt is no longer asserted. The service processor follows the current temperature threshold by keeping a counter of the number of interrupts it detects on the temperature threshold interrupt line, such that a pointer into the threshold table is synchronized with the threshold table of the temperature switch.

Figure 4:
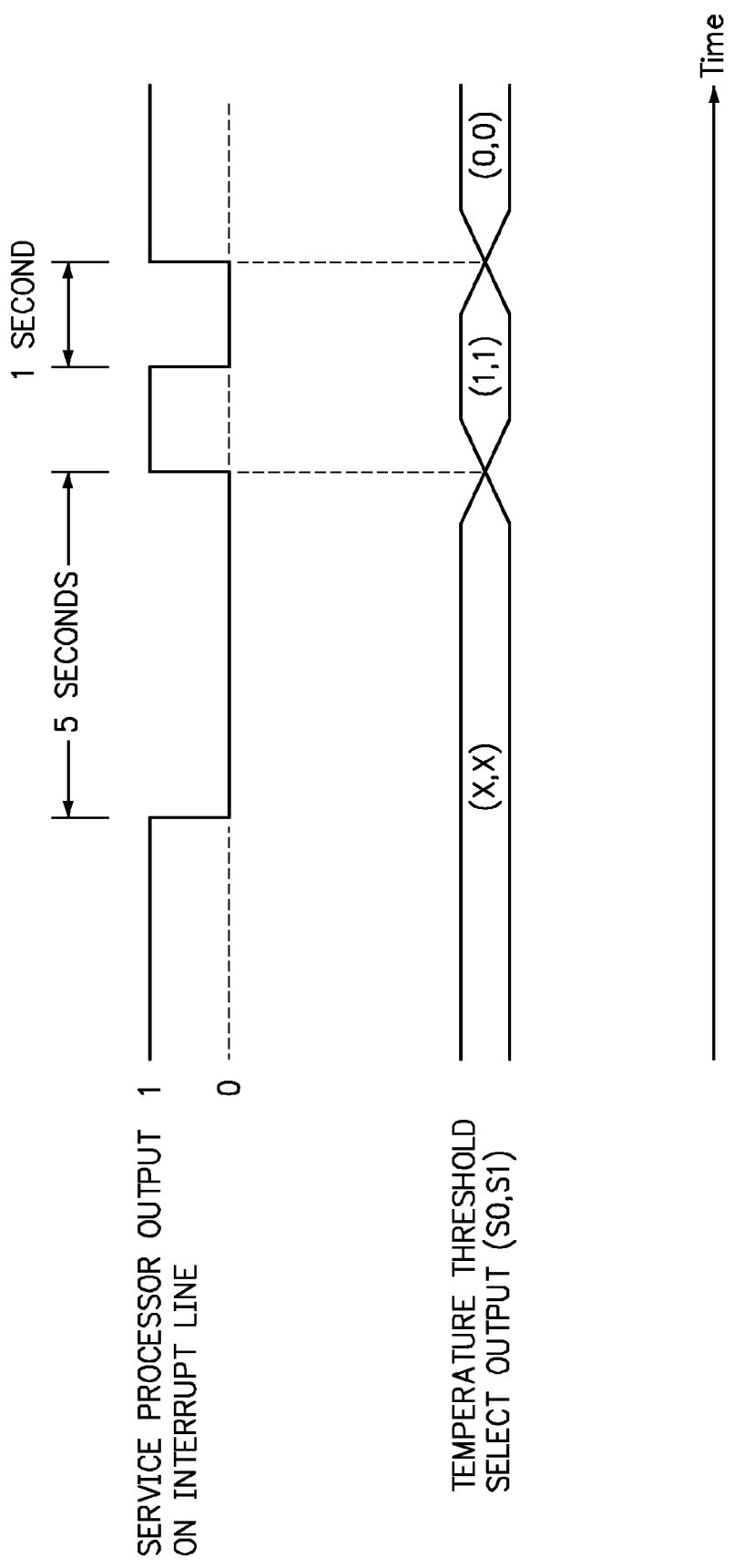
FIG. 4 is a timing diagram during a period that the service processor resets the temperature threshold of the temperature switch.

FIG. 4 is a timing diagram during a period that the service processor resets the temperature threshold of the temperature switch. As shown in the first row labeled "Service Processor Output on Interrupt Line", the service processor asserts an interrupt (logical "0") on the interrupt line for a duration of 5 seconds, pauses for one second (logical "1"), then asserts an interrupt for one second (logical "0"). The logic device monitors the interrupts and can distinguish an interrupt of a first predetermined duration (i.e., 5 seconds) from an interrupt having a second predetermined duration (i.e., 1 second). In response to the detecting an interrupt having the first duration (i.e., 5 seconds), the logic device resets the state of its temperature threshold select output to (1,1) regardless of the current state of the temperature threshold select output (X,X; where X is independently selected from 0 and 1). This is illustrated in the second row labeled "Temperature Threshold Select Output (S0, S1)."

Then, since the service processor asserts a further interrupt having the second duration (i.e., 1 second), the logic device increments the temperature threshold select output to (0,0), which is associated with the original temperature threshold in accordance with the threshold table of FIG. 2. The foregoing process may be desirably performed when the service processor or the temperature switch have been powered off or reset, such that there may be doubt whether the threshold tables are synchronized. Alternatively, if the system implements a large number of temperature threshold select input values, the foregoing process may be used as a shortcut to return the temperature threshold to the lowest value. It should be recognized that the service processor may, at any time, cause an interrupt assertion such that the temperature threshold is incremented as shown in response to the second duration interrupt (i.e., 1 second) on the right-hand side of FIG. 4.

Figure 5:
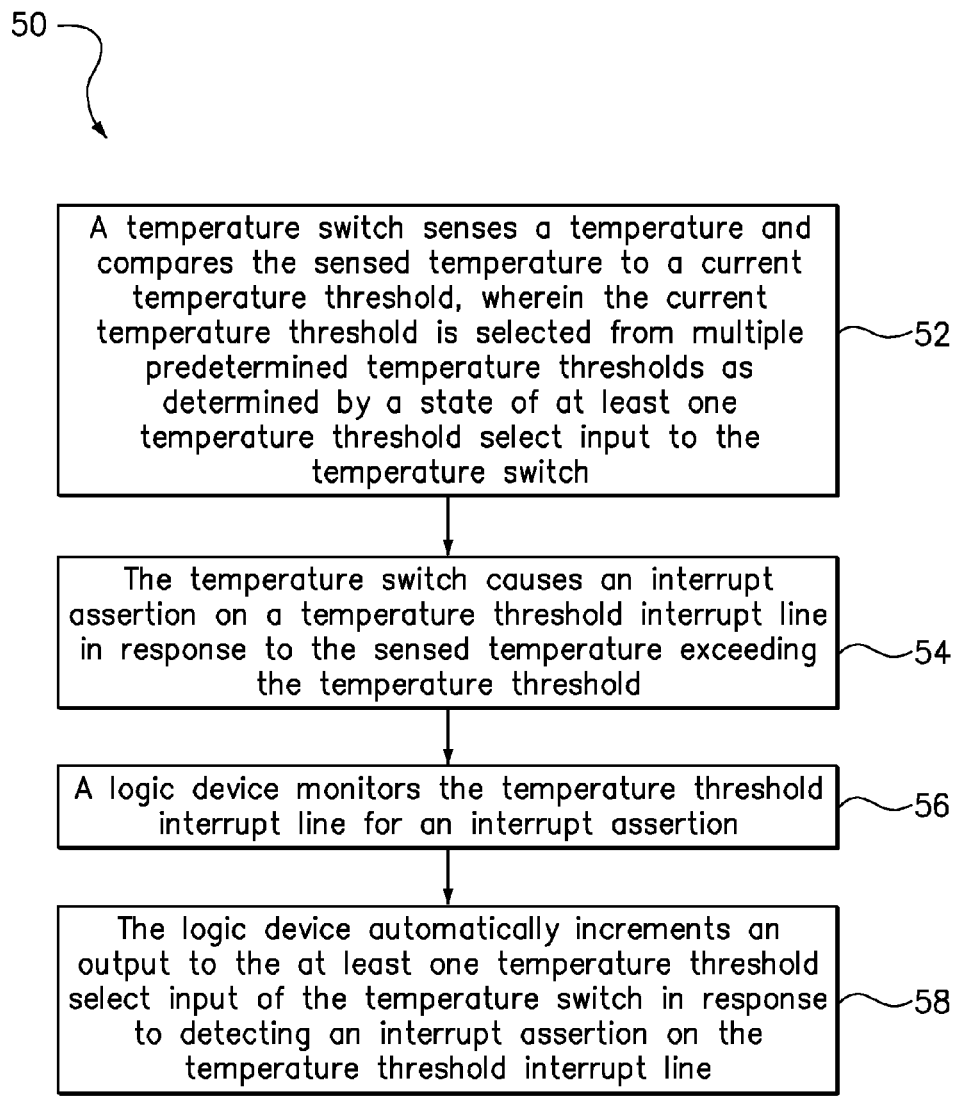
FIG. 5 is a flowchart of a method in accordance with an embodiment of the present invention.

FIG. 5 is a flowchart of a method 50 in accordance with an embodiment of the present invention. In step 52, a temperature switch senses a temperature and compares the sensed temperature to a current temperature threshold, wherein the current temperature threshold is selected from multiple predetermined temperature thresholds as determined by a state of at least one temperature threshold select input to the temperature switch. In step 54, the temperature switch causing an interrupt assertion on a temperature threshold interrupt line in response to the sensed temperature exceeding the temperature threshold. A logic device monitors the temperature threshold interrupt line for an interrupt assertion in step 56. Then, in step 58, the logic device automatically increments an output to the at least one temperature threshold select input of the temperature switch in response to detecting an interrupt assertion on the temperature threshold interrupt line.

The foregoing computer program products may further include computer readable program code for implementing or initiating any one or more aspects of the methods described herein. Accordingly, a separate description of the methods will not be duplicated in the context of a computer program product.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention may be described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, and/or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method, comprising:
   a temperature switch sensing a temperature and comparing the sensed temperature to a current temperature threshold, wherein the current temperature threshold is selected from multiple predetermined temperature thresholds as determined by a state of at least one temperature threshold select input to the temperature switch;
   the temperature switch causing an interrupt assertion on a temperature threshold interrupt line in response to the sensed temperature exceeding the temperature threshold;
   a logic device monitoring the temperature threshold interrupt line for an interrupt assertion;
   the logic device automatically incrementing an output to the at least one temperature threshold select input of the temperature switch in response to detecting an interrupt assertion on the temperature threshold interrupt line;
   a service processor counting a number of interrupt assertions detected on the temperature threshold interrupt line, wherein the service processor stores a list of the multiple predetermined temperature thresholds and identifies the current temperature threshold by the counted number of interrupt assertions;
   the service processor causing an interrupt assertion on the temperature threshold interrupt line for a duration exceeding a predetermined duration;
   the logic device resetting the temperature threshold select output to the temperature switch in response to detecting an interrupt assertion that exceeds the predetermined duration, wherein the temperature threshold select out is reset to a predetermined temperature threshold select value; and
   the service processor resetting the count of the number of interrupt assertions.

2. The method of claim 1, wherein the temperature switch senses the temperature with a remote junction that is physically spaced apart from the temperature switch.

3. The method of claim 1, wherein the temperature threshold interrupt line is driven by a resistor to a logical "1" signal, and wherein the temperature switch causes an interrupt assertion on the temperature threshold interrupt line using a single open-drain signal.

4. The method of claim 3, wherein the logic device detects an interrupt assertion in response to a falling edge of a signal on the temperature threshold interrupt line.

5. The method of claim 1, further comprising:
   the temperature switch updating the current temperature threshold to a value selected from multiple predetermined temperature thresholds as determined by a state of the at least one temperature threshold select input to the temperature switch.

6. The method of claim 5, further comprising:
   the temperature switch deasserting the interrupt assertion in response to the updated current temperature threshold exceeding the sensed temperature.

7. The method of claim 1, wherein the logic device provides digital signals to the temperature threshold select input of the temperature switch.

8. The method of claim 1, wherein the logic device provides signals having more than two possible states to the temperature threshold select input of the temperature switch.

9. The method of claim 1, wherein the temperature switch and logic device are installed on an expansion card, the service processor is installed on a motherboard, and the expansion card is installed in an expansion slot of on the motherboard.

10. An apparatus, comprising:
    a temperature switch having a temperature sensor, a temperature threshold select input, and an output to a temperature threshold interrupt line, wherein the temperature switch selects a current temperature threshold from multiple predetermined temperature thresholds as determined by a state of the temperature threshold select input, and wherein the temperature switch causes an interrupt assertion on the temperature threshold interrupt line in response to the temperature sensor indicating a sensed temperature that exceeds the temperature threshold; and
    a logic device having an input coupled to the temperature threshold interrupt line and a temperature threshold select output coupled to the temperature threshold select input of the temperature switch, wherein the logic device automatically increments the temperature threshold select output in response to detecting an interrupt assertion on the temperature threshold interrupt line; and
    a service processor coupled to the temperature threshold interrupt line, wherein the service processor counts a number of interrupt assertions detected on the temperature threshold interrupt line, stores a list of the multiple predetermined temperature thresholds, identifies the current temperature threshold by the counted number of interrupt assertions, and selectively causes an interrupt assertion on the temperature threshold interrupt line for a duration exceeding a predetermined duration;

wherein the logic device resets the temperature threshold select output to the temperature switch in response to detecting an interrupt assertion that exceeds the predetermined duration, wherein the temperature threshold select out is reset to a predetermined temperature threshold select value, and wherein the service processor resets the count of the number of interrupt assertions.

11. The apparatus of claim 10, wherein the temperature switch and logic device are installed on an expansion card, the service processor is installed on a motherboard, and the expansion card is installed in an expansion slot of on the motherboard.

12. The apparatus of claim 10, further comprising:
a resistor coupled between a voltage source and the temperature threshold interrupt line, wherein the resistor drives a logical "1" signal on the temperature threshold interrupt line, wherein the output from the temperature switch to the temperature threshold interrupt line is an open-drain pin, and wherein the service processor has an open-drain pin coupling the service processor to the temperature threshold interrupt line.

13. The apparatus of claim 12, wherein the logic device detects an interrupt assertion in response to a falling edge of a signal on the temperature threshold interrupt line.

14. The apparatus of claim 10, wherein the temperature sensor is a remote junction that is physically spaced apart from the temperature switch.

15. The apparatus of claim 10, wherein the temperature threshold select output of the logic device provides digital signals to the temperature threshold select input of the temperature switch.

16. The apparatus of claim 10, wherein the temperature threshold select output of the logic device provides signals having more than two possible states to the temperature threshold select input of the temperature switch.

\* \* \* \* \*